(12) United States Patent
Lee et al.

(10) Patent No.: US 9,647,003 B2
(45) Date of Patent: May 9, 2017

(54) DISPLAY DEVICE

(71) Applicant: LG Display Co., Ltd., Seoul (KR)

(72) Inventors: JiHye Lee, Gyeonggi-do (KR);
HoYoung Jeong, Gyeonggi-do (KR);
YoungJang Lee, Seoul (KR);
BokYoung Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 14/506,847

(22) Filed: Oct. 6, 2014

(65) Prior Publication Data

US 2015/0161956 A1 Jun. 11, 2015

(30) Foreign Application Priority Data

Dec. 9, 2013 (KR) .......................... 10-2013-0152504

(51) Int. Cl.
*G09G 3/36* (2006.01)
*H01L 27/12* (2006.01)

(52) U.S. Cl.
CPC ......... *H01L 27/124* (2013.01); *G09G 3/3607* (2013.01); *G09G 3/3688* (2013.01);
(Continued)

(58) Field of Classification Search
CPC ......... G09G 2310/0297; G09G 3/3688; G09G 3/3607; G09G 3/3648; G09G 2310/08;
(Continued)

(56) References Cited

U.S. PATENT DOCUMENTS 7,508,479 B2 * 3/2009 Kim .................. G09G 3/3688
349/149
8,427,461 B2 * 4/2013 Lin .................. G09G 3/3688
345/100
(Continued)

FOREIGN PATENT DOCUMENTS

CN 101206835 A 6/2008
CN 100538449 C 9/2009
(Continued)

OTHER PUBLICATIONS

Examination Statement mailed Jan. 15, 2016 from the Taiwan Advance Patent & Trademark Office in counterpart Taiwanese application No. 103142486.
(Continued)

*Primary Examiner* — Duc Dinh
(74) *Attorney, Agent, or Firm* — Morgan, Lewis & Bockius LLP

(57) ABSTRACT

A display device includes a display panel including gate lines and data lines, the gate lines and the data lines intersecting, and pixels defined at the intersections of the gate lines and data lines, a gate driver to sequentially output a gate driving signal to the gate lines, a data driver to sequentially output a data signal to channels, a switching controller to electrically connect one of the channels with two or more of the data lines, the switching controller including a switch for each of the channels, wherein the two or more data lines are adjacent, one is directly connected to the channel and the other is connected to the channel through the switch, and a timing controller to provide a selection signal to the switch which controls the connection between the other of the two or more data lines and the channel.

14 Claims, 10 Drawing Sheets

(52) U.S. Cl.
CPC . *H01L 27/1259* (2013.01); *G09G 2310/0297* (2013.01); *G09G 2310/06* (2013.01)

(58) Field of Classification Search
CPC .. G09G 2370/08; G09G 2310/06; G09G 3/36; G09G 2230/00; G09G 2310/0235; G09G 2310/0272; G09G 2310/0275; G09G 2310/0286; G09G 5/006; G09G 2300/0426; G09G 3/3291; G09G 3/3283; G09G 3/3659; G09G 2310/0262; G09G 3/3275; G09G 5/003
USPC ...... 345/87, 98, 99, 100, 690, 204, 211, 212
See application file for complete search history.

(56) References Cited

U.S. PATENT DOCUMENTS

| | | | | |
|---|---|---|---|---|
| 8,605,018 | B2* | 12/2013 | Lee | G09G 3/3688 345/204 |
| 2003/0090614 | A1 | 5/2003 | Kim et al. | |
| 2004/0140983 | A1 | 7/2004 | Credelle | |
| 2007/0057877 | A1 | 3/2007 | Choi et al. | |
| 2008/0055304 | A1 | 3/2008 | Ryu et al. | |
| 2008/0150844 | A1 | 6/2008 | Choi | |
| 2009/0207119 | A1 | 8/2009 | Han et al. | |
| 2009/0262048 | A1 | 10/2009 | Park et al. | |
| 2011/0175858 | A1 | 7/2011 | Lee et al. | |
| 2011/0221715 | A1* | 9/2011 | Yang | G02F 1/13454 345/204 |
| 2013/0141320 | A1 | 6/2013 | Kim | |
| 2014/0240379 | A1* | 8/2014 | Jeong | G09G 3/2003 345/691 |

FOREIGN PATENT DOCUMENTS

| | | |
|---|---|---|
| CN | 100547637 C | 10/2009 |
| CN | 103137089 A | 6/2013 |
| KR | 20080041526 A | 5/2008 |
| TW | 201137481 A | 11/2011 |
| TW | 201434023 A | 9/2014 |
| WO | 2004-068457 A2 | 8/2004 |

OTHER PUBLICATIONS

Chinese Office Action dated Sep. 5, 2016, in Chinese patent application No. 201410738784.8.

* cited by examiner

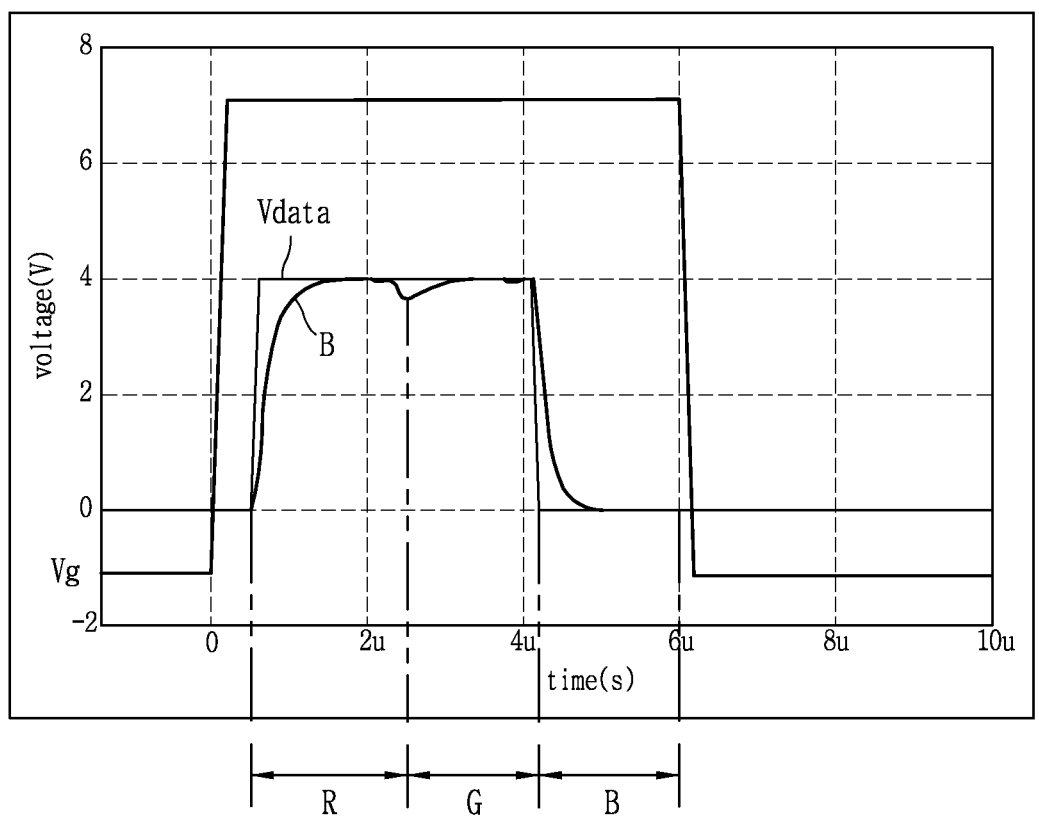

DISPLAY DEVICE

CROSS-REFERENCE TO RELATED APPLICATIONS

This application claims the benefit of Korean Application No. 10-2013-0152504, filed on Dec. 9, 2013, the content of which is incorporated by reference herein in its entirety for all purposes.

BACKGROUND OF THE DISCLOSURE

1. Field of the Disclosure

This specification relates to a liquid crystal display (LCD) device, and particularly, to increasing the space available in the driving circuitry of an LCD device, the LCD device having a reduced number of data driver channels shared between neighboring pixels through a multiplexer (MUX). The LCD device of the present disclosure may increase space availability by reducing the number of transistors included in the MUX.

2. Background of the Disclosure

With the development of electronic information devices, such as various types of portable devices, for example, mobile phones and notebook computers, HDTV and the like, which can realize images with high resolution and high quality, the demands on the flat panel displays used in these devices are increasing. Such flat panel displays may include a liquid crystal display (LCD) device, a plasma display panel (PDP) device, a field emission display (FED) device, an organic light emitting diodes (OLED) device, or the like. The LCD device is the most widely studied of these devices with regard to mass production technology, facilitation of driving means, realization of images with high qualities, and implementation of large-scale screens.

The LCD device generally has a structure including a liquid crystal display panel provided with a plurality of gate lines, a plurality of data lines intersecting with the gate lines, and a plurality of pixels each having a thin film transistor as a switching element disposed on each intersection, to realize a gradation (or gray scale) of an image according to changes in optical transmittance of liquid crystals in response to a data signal applied to each pixel. In such a structure, each pixel typically has to be connected with at least one gate line and at least one data line, one data line has to be assigned to each pixel arranged along the same horizontal line, and each data line has to be connected to one channel of a data driver that supplies a data signal, in a manner of one-to-one correspondence.

However, the trend of large-scale and high resolution LCD devices has given rise to a gradual increase in the number of data lines. This has caused an increase in the number of channels of a data driver. Also, as a line (pipe) structure for these data lines becomes more complicated, fabrication costs of the data driver have increased.

To solve these problems, a structure of sharing the channels of the data driver such that two or more data lines share one channel has been proposed. For example, FIG. 1 is a view illustrating a part of an LCD device to which this related art channel-sharing structure is applied. FIG. 1 shows an example structure employing a 3×1 multiplexer connecting three data lines to one channel.

As illustrated in FIG. 1, an LCD device having a channel sharing structure such as that of the related art may have a liquid crystal display panel 10 divided into a display region having a plurality of pixels PX, and a non-display region located between the display region and a data driver (not illustrated). Also, the LCD device may be provided with a switching circuit 50 having a plurality of switching elements MT1 to MT3 on the non-display region. The plurality of switching elements MT1 to MT3 connect data lines DLm-2, DLm-1, and DLm, which are connected to three neighboring pixels R, G, and B, respectively, to one channel Chn.

The switching circuit 50 drives the switching elements MT1 to MT3 in a time-division manner such that one horizontal period, during which time a gate driving signal Vg is applied, is divided into three sections (as shown for example in the signal waveform of FIG. 2) according to control signals S1 to S3 of a multiplexer mounted in a timing controller or a data driver (not illustrated), so as to apply data signals for pixels R, G, and B, respectively. This sort of arrangement is capable of reducing the number of channels of the data driver by one third ($\frac{1}{3}$) as compared with conventional art.

The time-division discussed above is a method of dividing one horizontal period into three sections, turning on the first switching element MT1 to charge the pixel R through the data lines DL1, DLm-2, and then turning on the second switching element MT2 to charge the pixel G through the data lines DL2, DLm-1.

However, in the structure of the switching circuit 50 of this related art, the switching elements MT1, MT2, and MT3 should be connected to the data lines DLm-2, DLm-1 and DLm in a one-to-one correspondence. A high-resolution LCD device can suffer from having to arrange the switching elements MT1, MT2, and MT3 within the limited space of the non-display region. This limited space issue is exacerbated by the recent trends of reducing the pitch between pixels. Also, it may be difficult to implement an LCD device employing a narrow bezel which minimizes a width of the non-display region.

SUMMARY OF THE DISCLOSURE

In an embodiment of the invention, a liquid crystal display (LCD) device includes a liquid crystal display panel including a plurality of gate lines and a plurality of data lines, the plurality of gate lines and the plurality of data lines intersecting, and a plurality of pixels defined at the intersections of the pluralities of gate lines and data lines; a gate driver configured to sequentially output a gate driving signal to the plurality of gate lines; a plurality of channels; a data driver configured to sequentially output a data signal to the plurality of channels; a switching controller, the switching controller configured to electrically connect one of the channels with a corresponding two or more of the data lines, the switching controller including a switch for each of the plurality of channels, wherein the two or more data lines corresponding to one of the channels are adjacent to each other, one of the two or more data lines is directly connected to the one of the channels, and the other of the two or more data lines is connected to the one of the channels through the switch in the switching controller; and a timing controller configured to provide a selection signal to the switch in the switching controller, the selection signal controlling the electrical connection between the other of the two or more data lines and the one of the channels.

In an embodiment of the invention, a method of manufacturing a liquid crystal display device includes providing a liquid crystal display panel including a plurality of gate lines and a plurality of data lines, the plurality of gate lines and the plurality of data lines intersecting, and a plurality of pixels defined at the intersections of the pluralities of gate lines and data lines; providing a gate driver configured to sequentially output a gate driving signal to the plurality of gate lines; providing a plurality of channels; providing a data driver configured to sequentially output a data signal to the plurality of channels; providing a switching controller, the switching controller configured to electrically connect one of the channels with a corresponding two or more of the data lines, the switching controller including a switch for each of the plurality of channels, wherein the two or more data lines corresponding to one of the channels are provided to be adjacent to each other, one of the two or more data lines is directly connected to the one of the channels, and the other of the two or more data lines is connected to the one of the channels through the switch in the switching controller; and providing a timing controller configured to provide a selection signal to the switch in the switching controller, the selection signal controlling the electrical connection between the other of the two or more data lines and the one of the channels.

An LCD device in accordance with example embodiments may employ a structure, in which at least two data lines can share one channel, and a reduced number of switching elements. This may result in ensuring a wider blank for forming the switching element and facilitating for implementing a narrow bezel structure.

Further scope of applicability of the present application will become more apparent from the detailed description given hereinafter. However, it should be understood that the detailed description and specific examples, while indicating embodiments of the disclosure, are given by way of illustration only, since various changes and modifications within the spirit and scope of the disclosure will become apparent to those skilled in the art from the

BRIEF DESCRIPTION OF THE DRAWINGS

The accompanying drawings, which are included to provide a further understanding of the disclosure and are incorporated in and constitute a part of this specification, illustrate example embodiments and together with the description serve to explain the principles of the disclosure.

In the drawings:

FIGS. 5a-5d are views illustrating signal waveforms according to an image of an LCD device in accordance with an example embodiment disclosed herein.

DETAILED DESCRIPTION OF THE DISCLOSURE

Description will now be given in detail of a liquid crystal display (LCD) device in accordance with exemplary embodiments, with reference to the accompanying drawings.

Figure 1:
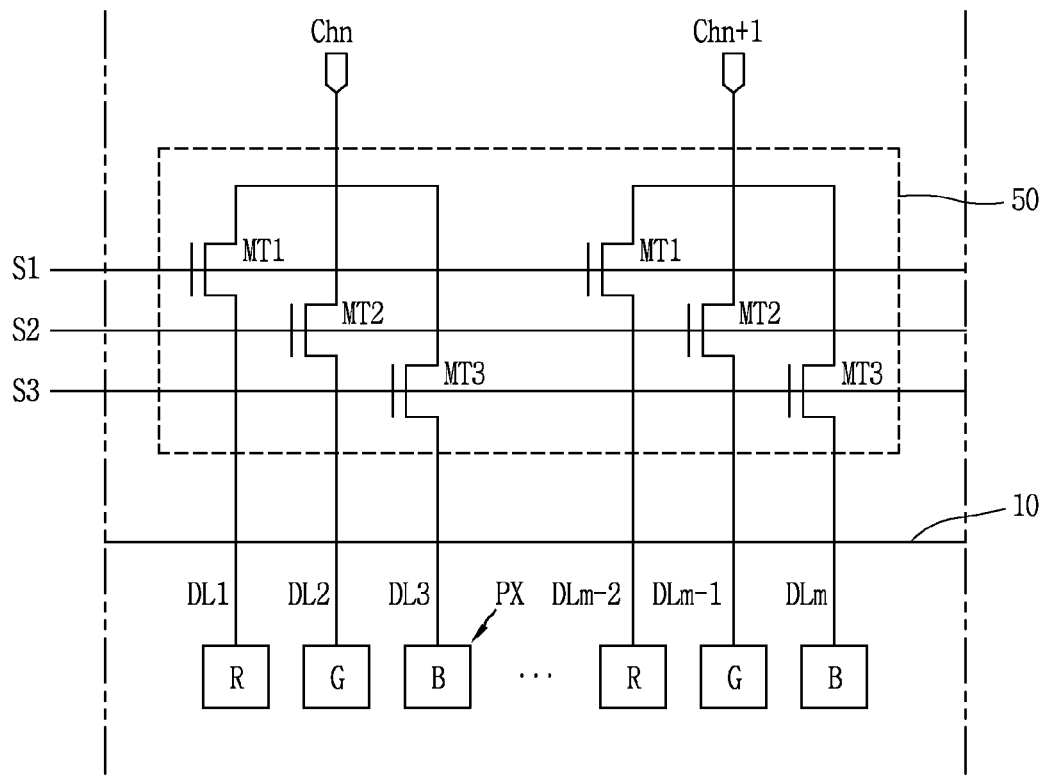
FIG. 1 is a view illustrating a part of an LCD device to which the related art channel-sharing structure is applied.
Figure 2:
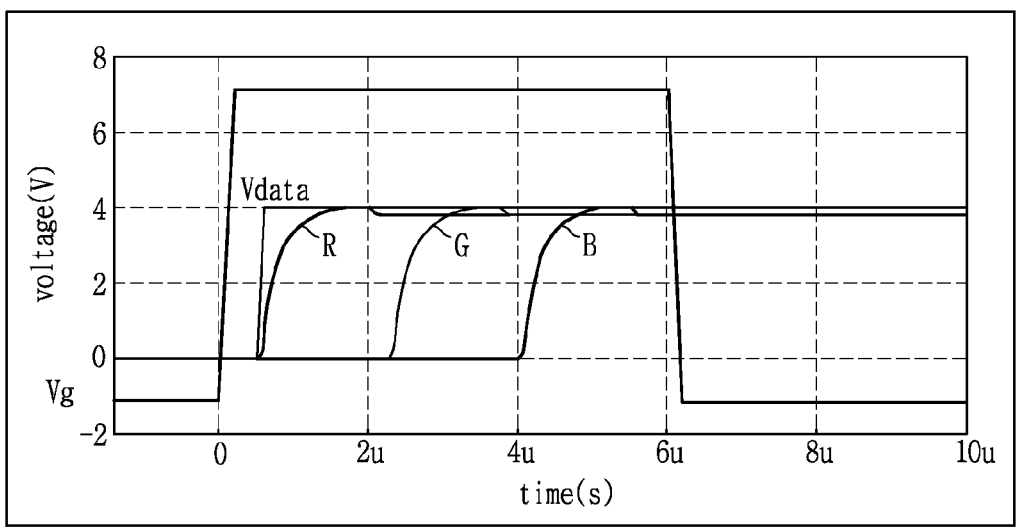
FIG. 2 is a view illustrating a signal waveform output in response to driving the LCD device of FIG. 1.
Figure 3:
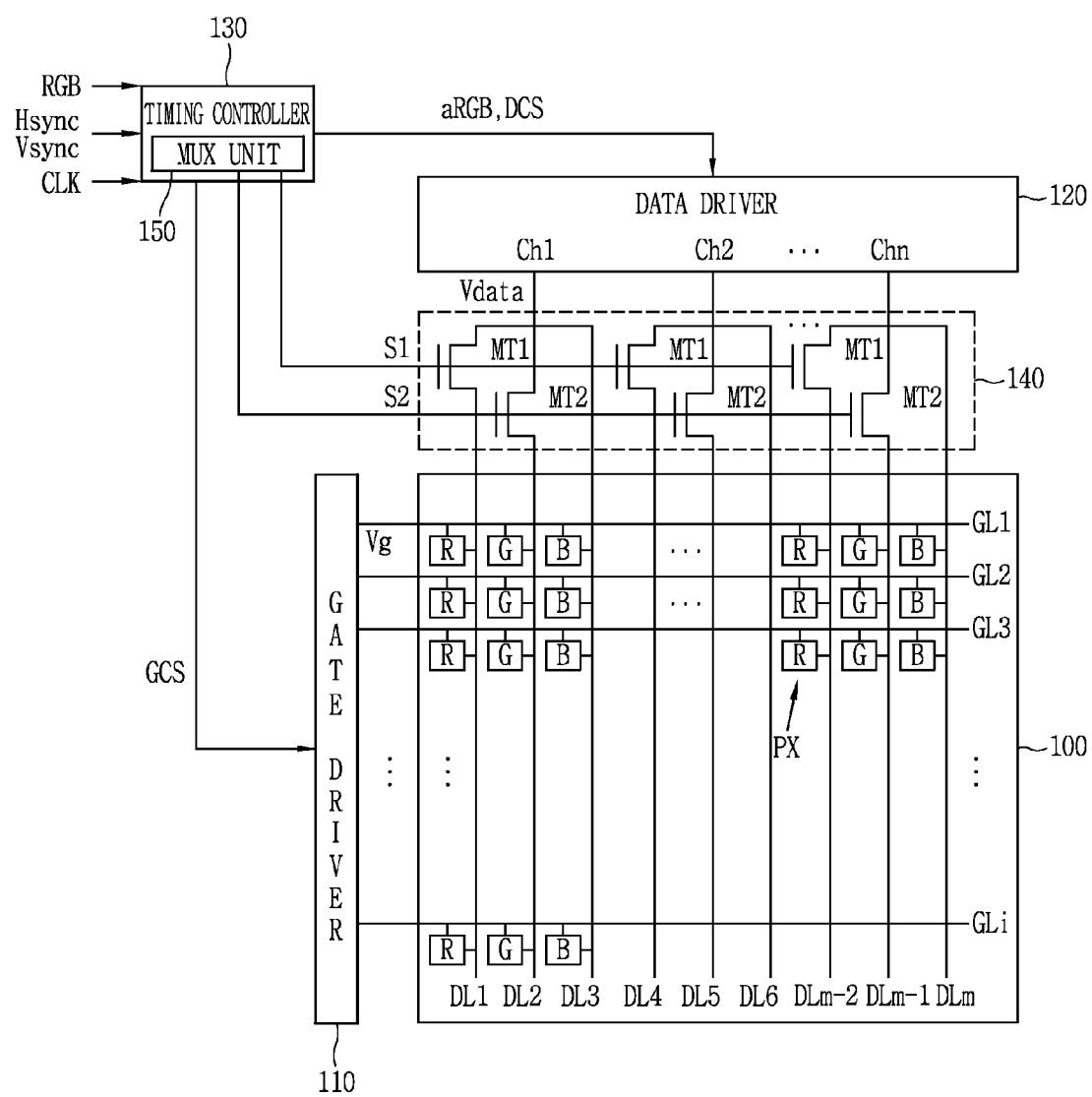
FIG. 3 is a view illustrating an entire structure of an LCD device in accordance with a first example embodiment disclosed herein.

FIG. 3 is a view illustrating a structure of an LCD device in accordance with a first example embodiment disclosed herein. As illustrated in FIG. 3, an LCD device disclosed herein may include a liquid crystal display panel 100 provided with a plurality of gate lines GL1 to GLi, a plurality of first to third data lines DL1 to DLm intersecting with the plurality of gate lines GL1 to GLi, and a plurality of pixels PX defined on the respective intersections, a gate driver 110 which sequentially outputs a gate driving signal Vg to the gate lines GL1 to GLi, a data driver 120 which sequentially outputs a data signal Vdata to the plurality of first to third data lines DL1 to DLm per ⅓ horizontal period (⅓ H), in synchronization with the gate driving signal Vg, a switching circuit 140 which electrically connects first and second data lines DLm-2 and DLm-1 to channels of the data driver 120 in an alternating manner, and a timing controller 130 which controls the gate and data drivers 110 and 120 and the switching circuit unit 140. The channels Ch1 to Chn may always be electrically connected to the third data lines DL3, DLm.

The liquid crystal display panel 100 may be configured such that the plurality of gate lines GL1 to GLi and the plurality of data lines DL1 to DLm intersect with each other in a matrix form on a glass or plastic substrate, and the plurality of pixels PX are defined on the intersections, respectively. The pixels PX may be arranged in a matrix form. Each of the pixels PX may include three sub pixels R, G, and B corresponding to three primary colors of red, green, and blue, respectively. Each of the sub pixels R, G, and B may include at least one thin film transistor (TFT) and a liquid crystal capacitor (not illustrated).

In the TFTs of the sub pixels, a gate electrode may be connected to the gate line GL1 to GLi, a drain electrode may be connected to the data line DL1 to DLm, and a source electrode may be connected to a pixel electrode corresponding to a common electrode, so as to define one pixel. An active layer of the TFT may generally be formed of amorphous silicon (a-si silicon). However, the active layer may also be made of poly silicon or an oxide semiconductor, taking into account the characteristic of the TFT.

The gate driver 110 may sequentially output a gate driving signal Vg per each horizontal period 1H to the gate lines GL to GLi formed on the liquid crystal display panel 100. This sequential output may be in response to a gate control signal GCS input to the gate driver 110 from the timing controller 130. Accordingly, the TFT connected to each gate line GL1 to GLi may be turned on for one horizontal period. In synchronization with this, the data driver 120 may output a data signal Vdata with an analog waveform to the data lines DL1 to DLm in order for the data signal Vdata to be applied to pixels connected to the TFTs. As will be discussed below, the data driver 120 may output this data signal Vdata to the data lines DL1 to DLm through channels Chn and switching controller 140.

The gate control signal GCS provided to the gate driver 110 may include a gate start pulse (GSP), a gate shift clock (GSC), a gate output enable (GOE) and the like. The gate start pulse (GSP) is a signal which may serve to decide a period for outputting a gate driving signal to a first gate line GL1. The gate start pulse (GSP) may be applied to a shift register (not illustrated) of the gate driver 110. The gate shift clock (GSC) is a clock signal and may be commonly applied to each shift register, and in synchronization, the next shift register may be activated. Also, the gate output enable (GOE) is a signal which may control an output of the shift register.

In response to the data control signal DCS input from the timing controller 130, the data driver 120 may convert an aligned digital image signal aRGB into the analog data signal Vdata according to a reference voltage. The aforementioned data signal Vdata may be latched by one horizontal line, and input to the liquid crystal display panel 100 simultaneously to all the data lines DLs for one horizontal period 1H. The data control signal DCS may include a source start pulse (SSP), a source shift clock (SSC), a source output enable (SOE), and the like.

The source start clock (SSP) is a signal that serves to decide a sampling start timing of image data of the data driver 120. The source shift clock (SSC) is a clock signal that controls a data sampling operation in the data driver 120. Also, the source output enable (SOE) is a signal controlling an output of the data driver 120.

As noted above, the data driver 120 may include the channels Chn. These channels Chn may be ½ or ⅓ of the number of the data lines DL1 to DLm, and may be connected to every data line DL1 to DLm through the switching controller 140. FIG. 3 illustrates an example where three data lines DLm-2, DLm-1, and DLm are connected to one channel Chn.

The data driver 120 may output the data signal Vdata with an analog waveform to the sub pixels R, G, and B, which are located on a corresponding horizontal line, by ⅓ of a horizontal period (⅓H) each, when a gate driving signal Vg of high potential is applied to one gate line GLi for one horizontal period 1H.

The timing controller 130 may receive timing signals, such as a digital-form image signal RGB, a horizontal sync signal Hsync, a vertical sync signal Vsync, a data enable clock signal CLK, and the like, transmitted from an external system (not illustrated), and may thereby generate control signals of the gate driver 110, the data driver 120 and the switching controller 140. Furthermore, the timing controller 130 may receive the image signal RGB by, for example, a typical interfacing method, and align the received image signal RGB into aligned RGB (aRGB) for output into a form that the data driver 120 can process.

The switching controller 140 may include first and second switching transistors MT1 and MT2 which connect at least two of the three data lines DLm-2, DLm-1, and DLm on the liquid crystal display panel 100 to one channel Chn of the data driver 120 in an alternating manner according to selection signals S1 and S2. In this example, the first switching transistors MT1 may be connected to the data lines DL1, DL4, and DLm-2 which are connected to the sub pixels R, and the second switching transistors MT2 may be connected to the data lines DL2, DL5, and DLm-1 which are connected to the sub pixels G. Meanwhile, the data lines DL3, DL6, and DLm connected to the sub pixels B may be connected directly to each channel Ch1 to Chn of the data driver 120 without a switching transistor.

Here, the connection structure with the data lines which are connected to the first and second switching transistors MT1 and MT2 may not be fixed, but may be decided by an output order of the data signal Vdata. The switching transistor may not be connected between the respective channel and the last-charged pixel among those sub pixels R, G, and B. For example, if it is presumed that pixels are charged in the order of B→G→R per horizontal line, the first switching transistors MT1 may be connected to the third, sixth, and mth data lines DL3, DL6, and DLm, and the second switching transistors MT2 may be connected to the second, fourth and m-1 th data lines DL2, DL4, and DLm-1.

Also, the selection signals S1 and S2 may be applied to the first and second switching transistors MT1 and MT2, respectively, by different timings, such that the first and second switching transistors MT1 and MT2 can operate in an alternating manner within one horizontal period. The selection signals S1 and S2 may be generated by a multiplexer (MUX) unit 150 which is provided in the timing controller 130 or the data driver 120, or provided as a separate integrated circuit (IC). In FIG. 3, the MUX unit 150 is illustrated as provided in the timing controller 130. Throughout this specification, the terms "multiplexer" and "MUX" are considered to include a device that performs demultiplexer (a "DEMUX") function such as those described herein.

The MUX unit 150 may serve to sequentially connect the channels Ch1 to Chn and the data lines DL1 to DLm by outputting the selection signals S1 and S2 in an alternating manner according to a charging timing of each pixel. The MUX unit 150 may include 2×1 multiplexers. In an example, the MUX unit 150 may output the first selection signal Si with high potential for an initial ⅓ (⅓H) of one horizontal period 1H to turn on the first switching transistors MT1. Accordingly, each channel Ch1 to Chn may be connected to the first, fourth and m-2th data lines DL1, DL4, and DLm-2 such that the sub pixels R can be charged. The MUX unit 150 may output the first signal S1 with low potential and the second selection signal S2 with high potential for the next ⅓(⅓H) of one horizontal period to turn off the first switching transistors MT1. Accordingly, each channel Ch1 to Chn may be connected to the second, fifth and m-1th data lines such that the data signal Vdata is charged in the sub pixels G.

Here, the third, sixth and mth data lines DL3, DL6, and DLm are always connected to each channel Ch1 to Chn. Therefore, the data signal Vdata is also charged simultaneously in the sub pixels B when the sub pixels R and G are charged. However it has been found that ⅔ of a horizontal period (⅔H) (the time of two ⅓ periods during which the R and G sub pixels are respectively charged) is a short enough time that a user may not recognize significant gradation variation, in consideration of the response speed of liquid crystal of each sub pixel R, G, and B. Therefore, the constant connection of the third, sixth, and mth data lines DL3, DL6, and DLm to channels Ch1 to Chn may not have a noticeable influence on image quality.

Afterwards, when the first and second switching transistors MT1 and MT2 are all turned off by outputting the first and second selection signals S1 and S2 with low potential for the remaining ⅓ horizontal period (⅓H), the data signal Vdata may be charged in the sub pixels B, because each channel Ch1 to Chn is always connected to the third, sixth and mth data lines DL3, DL6, and DLm.

The LCD device disclosed herein may significantly reduce the number of switching transistors as compared with the related art. This can result in a simplified structure for the switching circuit 140, and can ensure a wider area for each transistor within a limited region.

The first example embodiment illustrates a structure where three data lines are shared for one channel. However, the present disclosure may also be applied to an LCD device having a structure of sharing two data lines for one channel.

For example, an LCD device in accordance with a second example embodiment may include a liquid crystal display panel having a plurality of gate lines, a plurality of first and second data lines intersecting with the plurality of gate lines, and a plurality of pixels defined on each intersection, a gate driver that sequentially outputs a gate driving signal to the first and second gate lines, a data driver that sequentially outputs a data signal to the first and second data lines by (per) ½ horizontal period, respectively, in synchronization with the gate driving signal, a switching circuit which electrically connects the first data lines to channels of the data driver in an alternating manner, and a timing controller that controls the gate driver, the data driver and the switching circuit.

In this embodiment, the channels may always electrically be connected to the second data lines. That is, a switching transistor may be provided only between one of two neighboring data lines and the channel. The other data line may be directly connected to the corresponding channel. An odd-numbered data line and the channel may be connected for the initial ½ horizontal period (½H) of one horizontal period to charge a pixel, and an even-numbered data line and the channel may be connected for the next ½ horizontal period (½H) to charge a pixel. This embodiment merely needs one switching transistor per channel. Therefore, a MUX unit including multiplexers for driving the switching transistors may not be required, and the timing controller may generate and output only one selection signal for turning on or off the switching transistor at a corresponding timing.

Hereinafter is described an example method for driving an LCD device with reference to signal waveforms output upon driving the LCD device. For example, FIGS. 4 and 5 are views illustrating one signal waveform according to an image of an LCD device in accordance with an exemplary embodiment disclosed herein. For discussion purposes, the following description is given based on an LCD device with an example structure in which switching transistors are provided on data lines connected to sub pixels R and G of the sub pixels R, G, and B.

Figure 4A:
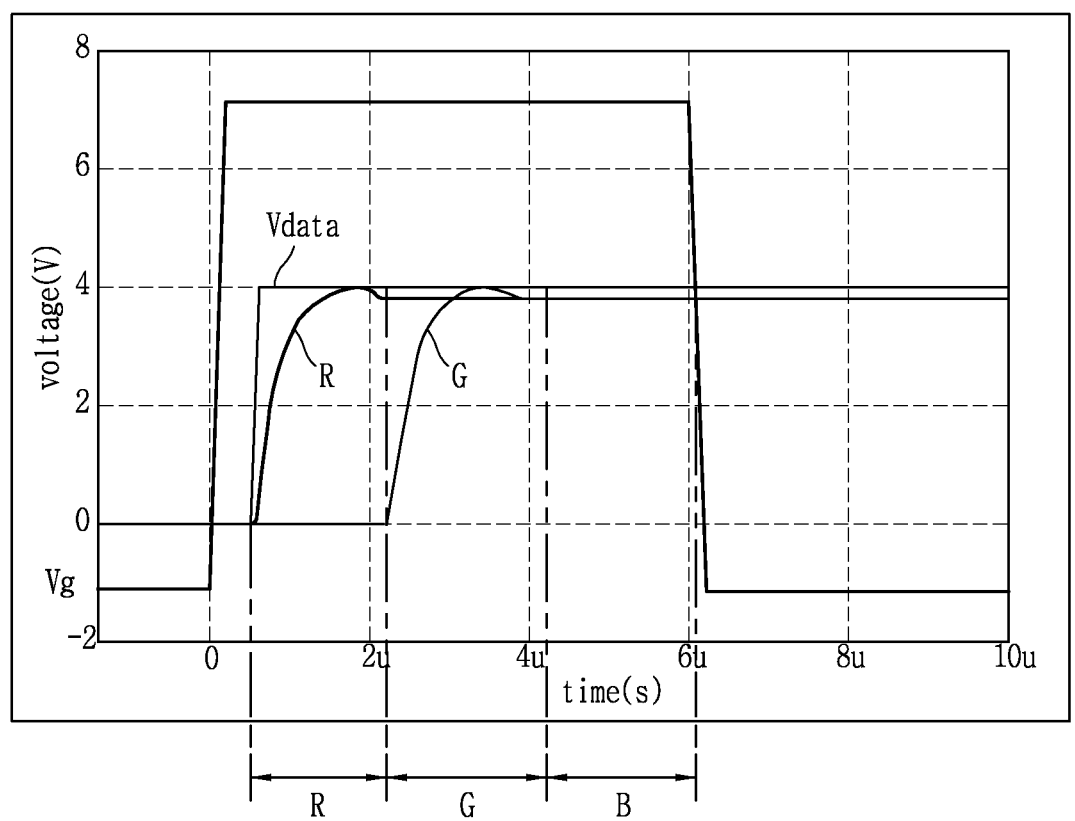
FIGS. 4a and 4b are views illustrating a signal waveform according to an image of an LCD device in accordance with an example embodiment disclosed herein.
Figure 4B:
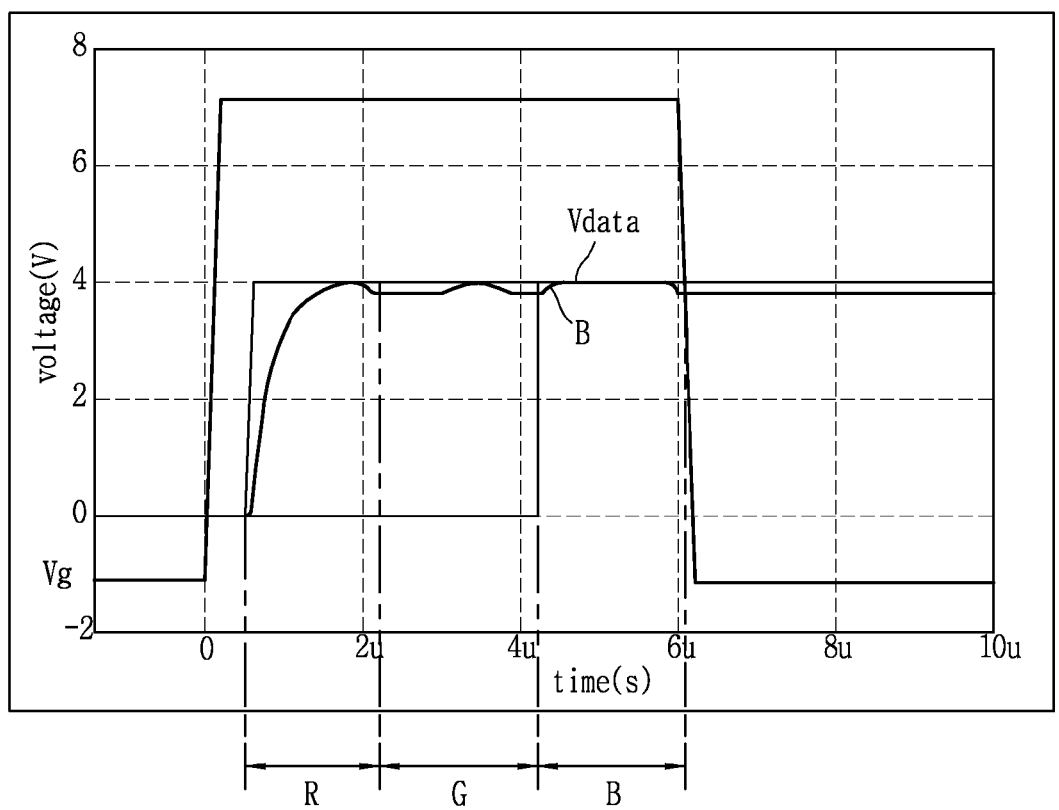

FIG. 4a illustrates an example of a signal waveform in a case in which a gradation (gray scale) of an image displayed on each sub pixel of R, G, and B is white—namely, every sub pixel equally has a 255 gray scale value. In this illustration, one horizontal period (1H) is 6 μs. FIG. 4a shows the voltages charged on the sub pixels R and G, while FIG. 4b shows the voltage charged on sub pixel B. With reference to FIG. 4a, first, a gate driving signal Vg of high potential is applied, and in turn, a first switching transistor is turned on for about ⅓ horizontal period (⅓H) such that a data signal Vdata is output to the sub pixel R for 2 μs. Here, a voltage which is actually charged in each sub pixel has a form considering an RC delay in the data signal Vdata. As noted above, and as illustrated in FIG. 4b (which shows the voltage of sub pixel B in a time simultaneous with that of sub pixels R and G shown in FIG. 4a), because the data line for the sub pixel B is always connected to the respective channel, the same voltage is also charged in the sub pixel B.

Afterwards, the first switching transistor is turned off and a second switching transistor is turned on, such that the data signal Vdata is charged in the sub pixel G for 2 μs. A voltage charged in the sub pixel B is also changed into the potential of the voltage charged in the sub pixel G. Next, the first and second switching transistors are all turned off and the data signal Vdata is applied to the sub pixel B for 2 μs. Here, in response to the turn-off of the first and second switching transistors, only the potential of the B sub pixel is changed, with the potentials of the sub pixels R and G being unchanged. In this example, for a gradation of a white image, all of the sub pixels R, G, and B represent the same gray scales. Also, since the sub pixel B has been charged with the voltage corresponding to the data signal Vdata of the sub pixel G, potential change is rare.

Figure 5B:
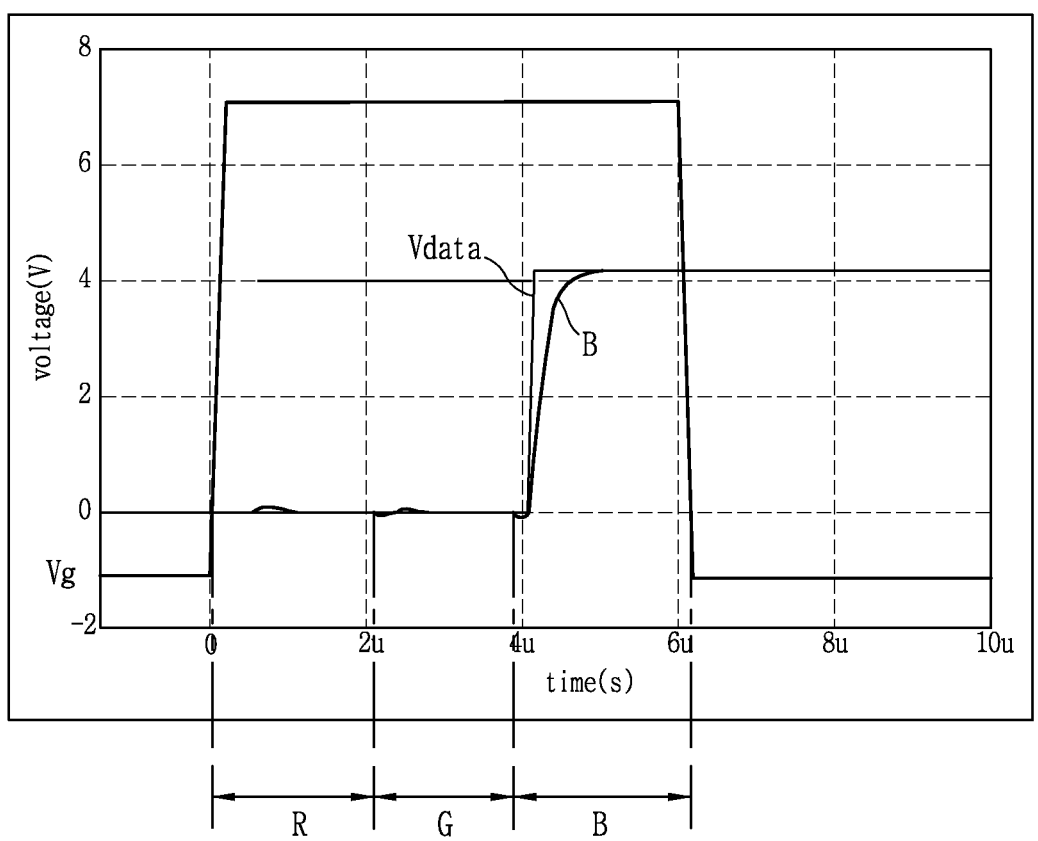

FIG. 5a illustrates an example of a signal waveform in the case of displaying an image having the sub pixels R and G with the same gray scale value and the sub pixel B with a different gray scale value, which illustrates a signal waveform in the case of the sub pixels R and G having a 255 gray scale value and the sub pixel B having a 0 gray scale value. FIG. 5b shows a case in which the sub pixels R and G have a 0 gray value and the sub pixel B has a 255 gray scale value. FIGS. 5a and 5b both show the voltage charged in sub pixel B but not that of sub pixels R and G With reference to FIG. 5a and in accordance with embodiments described above, when the sub pixels R and G have the 255 gray scale value and the sub pixel B has the 0 gray scale value, the first and second switching transistors are turned on in an alternating manner, such that the sub pixels R and G are sequentially charged with the 255 gray scale value by a data signal Vdata. Simultaneously, the same voltage is charged in the sub pixel B, such that the sub pixel B is also charged with the 255 gray scale value. However, when the first and second switching transistors are turned on and a data signal Vdata with the 0 gray scale value is output, the voltage of the sub pixel B is reduced down to a desired potential for 2 μs. A response speed of a liquid crystal is typically several milliseconds. Hence, even if the potential of the sub pixel B is changed, it may not affect an image quality, and a desired gray scale (or gradation) may be represented.

Also, with reference to FIG. 5b, even in the case of the sub pixels R and G having a 0 gray scale value and the sub pixel B having a 255 gray scale value, the sub pixels R and G are charged with the 0 gray scale value equally to the above case. Simultaneously, the sub pixel B is also charged with the same voltage, but the voltage of the sub pixel B corresponds to a desired 255 gray scale value for 2 μs, without affecting the image quality.

Figure 5C:
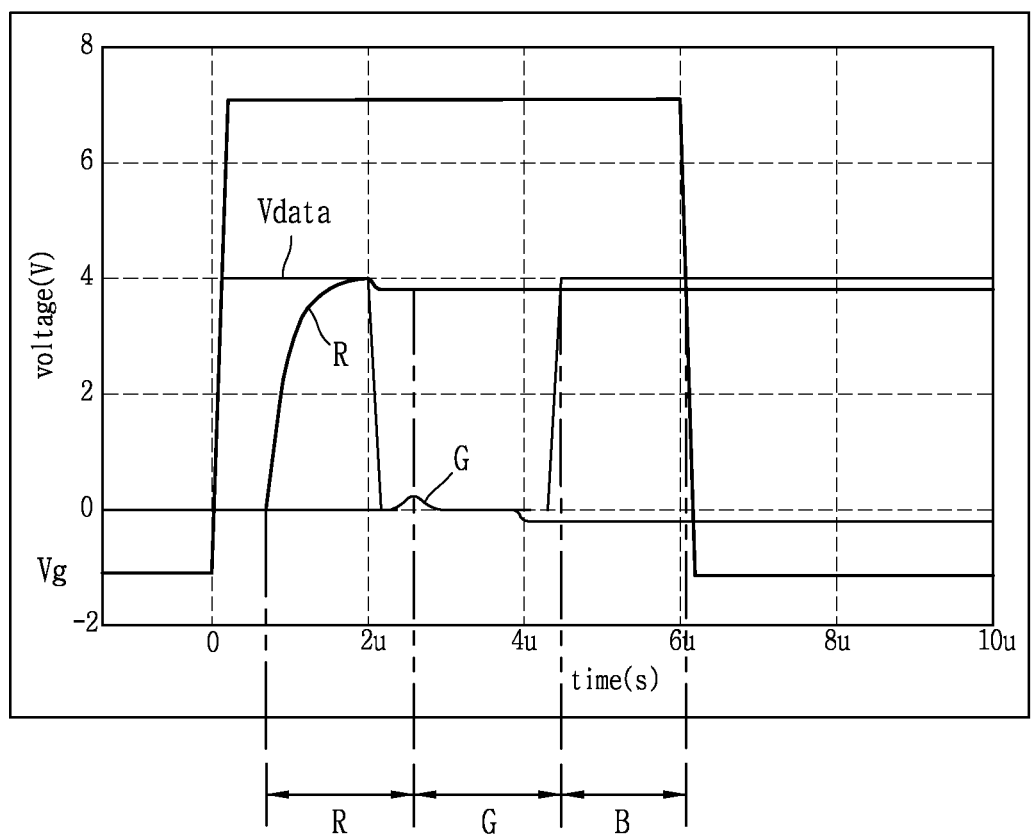
Figure 5D:
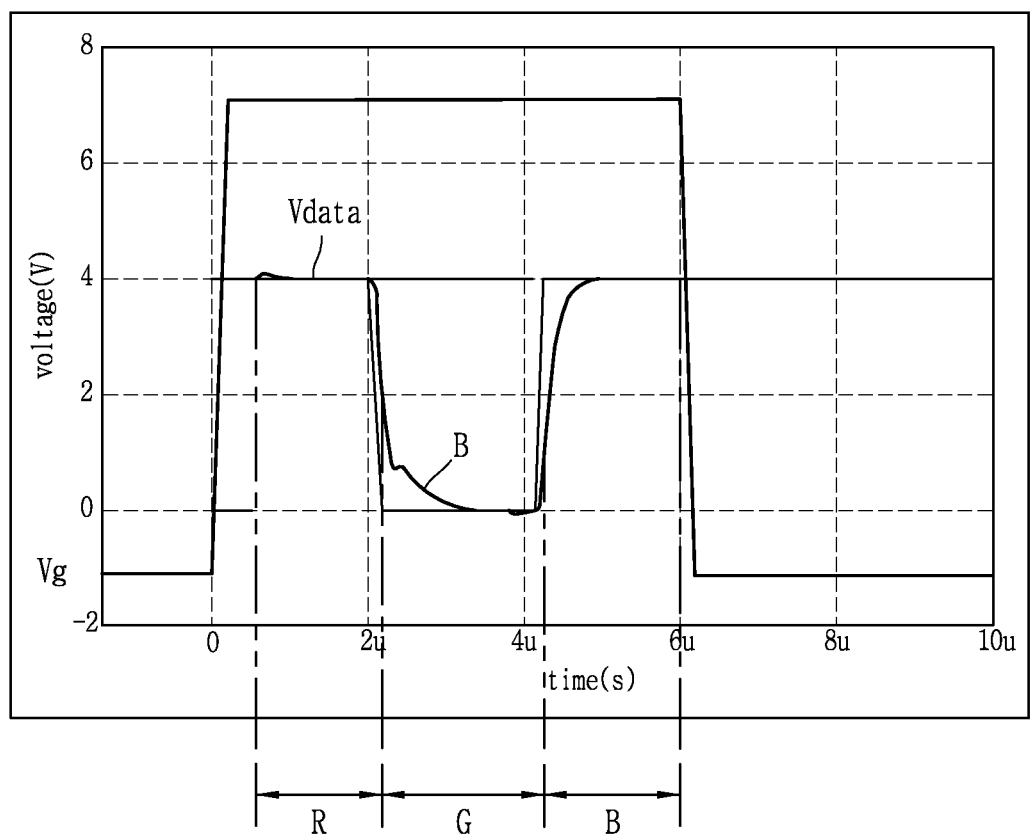

Shown in FIG. 5c is the case where the sub pixels R and B have the same gray scale value (255) and the sub pixel G is charged with a different gray scale value (0). FIG. 5c shows the voltages charged in sub pixels R and G but not sub pixel B. FIG. 5d shows a case in which the sub pixel B has the gray scale value 255 according to the data voltage Vdata. FIG. 5d shows the voltage charged in sub pixel B but not sub pixels R and G.

The above situations shown in FIGS. 4a-5d, where the gray scale values for the sub pixels have values of 0 and 255, are provided merely as examples. The embodiments are applicable to gray scales of any value.

Figure 6A:
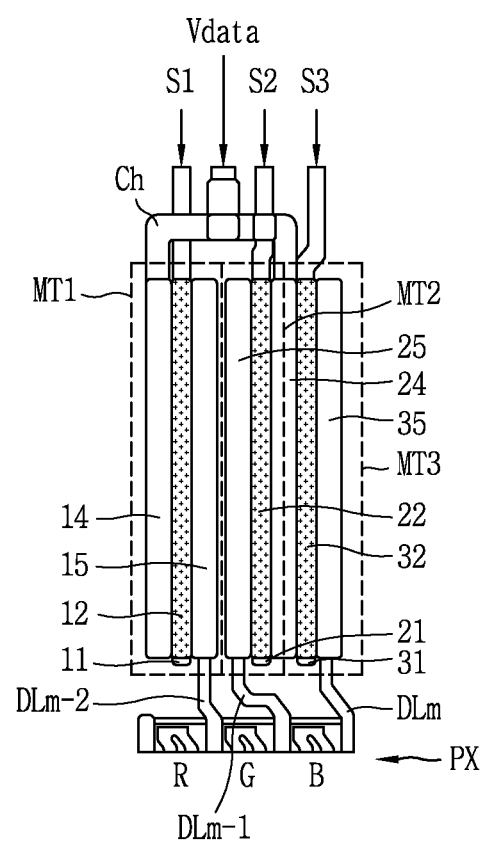
FIGS. 6a and 6b are comparative views of a structure of a switching circuit of the related art LCD and that of an LCD device disclosed herein.
Figure 6B:
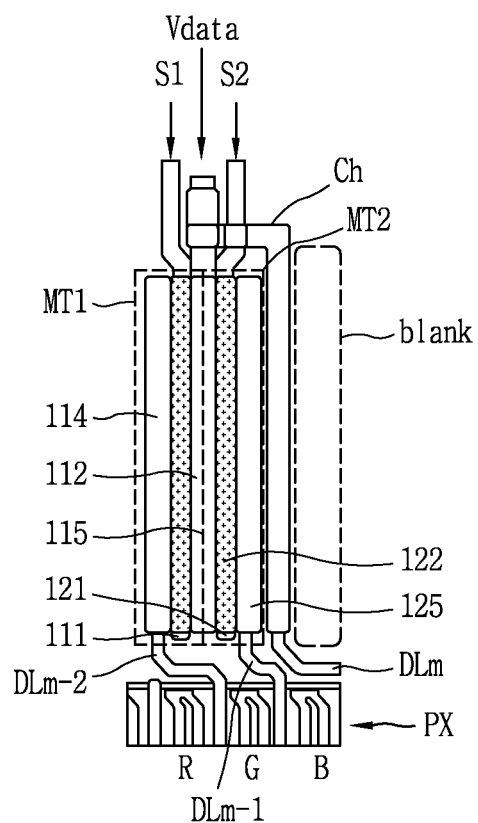

Hereinafter, description will be given of a structure of a switching circuit for an LCD device in accordance with a comparative example and an example embodiment. FIG. 6a shows a comparative example of a related switching circuit structure, while FIG. 6b shows a switching circuit structure according to present embodiments.

As illustrated in FIG. 6a, in a related art LCD device, one pixel PX includes three sub pixels R, G, and B, and the sub pixels R, G, and B are connected to data lines DLm-2, DLm-1, and DLm, respectively. Also, a switching circuit may include three switching transistors MT1, MT2, and MT3 connected to one channel Ch to which a data signal Vdata is output.

The first switching transistor MT1 may be provided with a gate electrode 11 which is connected with a line 12 to which a first selection signal S1 is applied, and drain and source electrodes 14 and 15 connected to the channel Ch and the data line DLm-2, which is connected the sub pixel R. The second switching transistor MT2 may be provided with a gate electrode 21 which is connected with a line 22 to which a second selection signal S2 is applied, and drain and source electrodes 24 and 25 connected to the channel Ch and the data line DLm-1, which is connected to the sub pixel G The third switching transistor MT3 may be provided with a gate electrode 31, which is connected with a line 32 to which a third selection signal S3 is applied, and drain and source electrodes 24 and 25 connected to the channel Ch and the data line DLm, which is connected to the sub pixel B.

In the related art structure, the drain electrode 24 of the second switching transistor MT2 and the drain electrode 24 of the third switching transistor MT3 are the same electrode, namely, the two transistors share the one electrode so as to reduce an entire width of the transistors. However, even if this single electrode is shared, there may be a limitation on the reduction of the entire width of the transistors MT1 to MT3.

In contrast, with reference to FIG. 6b and in an LCD device according to present embodiments, sub pixels R, G, and B are connected to data lines DLm-2, DLm-1, and DLm, respectively, and a switching circuit includes two switching transistor MT1 and MT2 connected to one channel Ch to which a data signal Vdata is output.

The first switching transistor MT1 may be provided with a gate electrode 111, which is connected with a line 112 to which a first selection signal S1 is applied, and source and drain electrodes 114 and 115 connected to the data line DLm-2, which is connected to the sub pixel R and the channel Ch. The second switching transistor MT2 may be provided with a gate electrode 121 which is connected with a line 122 to which a second selection signal S2 is applied, and drain and source electrodes 115 and 125 connected to the channel Ch and the data line DLm-1, which is connected to the sub pixel G In this example, the drain electrode 115 of the first switching transistor MT1 and the drain electrode 115 of the second switching transistor MT2 are the same electrode, and the two thin film transistors share the one electrode so as to reduce an entire width of those transistors.

Specifically, because the data line DLm connected to the sub pixel B is directly connected to the channel Ch, one less switching transistor (e.g., MT3) than that of the related structure may be required, which may result in ensuring a blank area not available in related art. Therefore, as compared to related art, the entire width of the switching circuit can be reduced by more than ⅓, and thus, a width of a pixel can be freely widened by as much as the additional space of the blank area. For example, to improve the characteristic of the switching transistors, a length of a semiconductor layer (not illustrated) may be reduced and a width thereof may be more ensured.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device, comprising:
  a display panel including a plurality of gate lines and a plurality of data lines, the plurality of gate lines and the plurality of data lines intersecting, and a plurality of pixels defined at the intersections of the pluralities of gate lines and data lines;
  a gate driver configured to sequentially output a gate driving signal to the plurality of gate lines;
  a plurality of channels;
  a data driver configured to sequentially output a data signal to the plurality of channels;
  a switching controller, the switching controller configured to electrically connect one of the channels with a corresponding two or more of the data lines, the switching controller including a switch for each of the plurality of channels,
  wherein the two or more data lines corresponding to one of the channels are adjacent to each other, one of the two or more data lines is directly connected to the one of the channels to directly receive data from the data driver, and the other of the two or more data lines is connected to the one of the channels through the switch in the switching controller; and
  a timing controller configured to provide a selection signal to the switch in the switching controller, the selection signal controlling the electrical connection between the other of the two or more data lines and the one of the channels,
  wherein each of the channels is a single electrical pathway from the data driver to the switching controller.

2. The display device of claim 1, wherein the gate driver is further configured to sequentially output the gate driving signal to each of the plurality of gate lines in one horizontal period.

3. The display device of claim 1, wherein the switch for each of the plurality of channels is a transistor.

4. The display device of claim 1, wherein there is no switch in the direct connection between the one of the channels and the one of the two or more data lines.

5. The display device of claim 1, wherein the data signal output to each of the plurality of channels is time divided into multiple signals.

6. The display device of claim 1, wherein the timing controller selects the switch to provide an electrical connection during a first portion of a horizontal period, and selects the switch not to provide the electrical connection during a latter portion of the horizontal period, the switching controller thereby providing only an electrical connection between the one of the two or more data lines and the one of the channels during the latter portion of the horizontal period.

7. The display device of claim 1, wherein the switching controller is configured to electrically connect the one of the channels with three of the data lines, the three data lines being data lines for red, green, and blue color pixels, the data line for the blue color pixel being directly connected to the one of the channels and the data lines for the red and green color pixels being connected to the one of the channels via switches.

8. A method of manufacturing a display device, comprising:
  providing a display panel including a plurality of gate lines and a plurality of data lines, the plurality of gate lines and the plurality of data lines intersecting, and a plurality of pixels defined at the intersections of the pluralities of gate lines and data lines;
  providing a gate driver configured to sequentially output a gate driving signal to the plurality of gate lines;

providing a plurality of channels;

providing a data driver configured to sequentially output a data signal to the plurality of channels;

providing a switching controller, the switching controller configured to electrically connect one of the channels with a corresponding two or more of the data lines, the switching controller including a switch for each of the plurality of channels, wherein the two or more data lines corresponding to one of the channels are provided to be adjacent to each other, one of the two or more data lines is directly connected to the one of the channels to directly receive data from the data driver, and the other of the two or more data lines is connected to the one of the channels through the switch in the switching controller; and providing a timing controller configured to provide a selection signal to the switch in the switching controller, the selection signal controlling the electrical connection between the other of the two or more data lines and the one of the channels, wherein each of the channels is a single electrical pathway from the data driver to the switching controller.

9. The method of claim 8, wherein the gate driver is further configured to sequentially output the gate driving signal to each of the plurality of gate lines in one horizontal period.

10. The method of claim 8, wherein the switch for each of the plurality of channels is a transistor.

11. The method of claim 8, wherein there is no switch in the direct connection between the one of the channels and the one of the two or more data lines.

12. The method of claim 8, wherein the data signal output to each of the plurality of channels is time divided into multiple signals.

13. The method of claim 8, wherein the timing controller selects the switch to provide an electrical connection during a first portion of a horizontal period, and selects the switch not to provide the electrical connection during a latter portion of the horizontal period, the switching controller thereby providing only an electrical connection between the one of the two or more data lines and the one of the channels during the latter portion of the horizontal period.

14. The method of claim 8, wherein the switching controller is configured to electrically connect the one of the channels with three of the data lines, the three data lines being data lines for red, green, and blue color pixels, the data line for the blue color pixel being directly connected to the one of the channels and the data lines for the red and green color pixels being connected to the one of the channels via switches.

* * * * *